United States Patent [19]

Eggenberger

[11] Patent Number: 5,734,663
[45] Date of Patent: Mar. 31, 1998

[54] ABBREVIATED TRIAL-AND-ERROR TECHNIQUE FOR CORRECTING LONG BURSTS OF CONSECUTIVE ERRORS USING CRC BYTES

[75] Inventor: John Scott Eggenberger, Sunnyvale, Calif.

[73] Assignee: International Business Machines Corporation, Armonk, N.Y.

[21] Appl. No.: 669,664

[22] Filed: Jun. 24, 1996

Related U.S. Application Data

[63] Continuation of Ser. No. 372,704, Jan. 13, 1995, which is a continuation of Ser. No. 239,163, May 6, 1994, which is a continuation of Ser. No. 810,280, Dec. 18, 1991, abandoned.

[51] Int. Cl.⁶ ............................................. H02M 13/00
[52] U.S. Cl. .......................................... 371/39.1; 371/37.7
[58] Field of Search ............................... 371/37.7, 39.1

[56] References Cited

U.S. PATENT DOCUMENTS

| | | | |
|---|---|---|---|
| 4,525,838 | 7/1985 | Patel | 371/37 |
| 4,706,250 | 11/1987 | Patel | 371/39 |
| 4,833,679 | 5/1989 | Anderson et al. | 371/38 |
| 4,849,975 | 7/1989 | Patel | 371/38 |
| 4,916,701 | 4/1990 | Eggenberger et al. | 371/37.7 |
| 5,027,357 | 6/1991 | Yu et al. | 371/37.7 |
| 5,157,669 | 10/1992 | Yu et al. | 371/37.7 |

OTHER PUBLICATIONS

IBM Tech. Disclosure Bulletin, "Internal Data Check Correction", vol. 32, No. 1, Jun. 1989.

Primary Examiner—Robert W. Beausoliel, Jr.
Assistant Examiner—P. Vales
Attorney, Agent, or Firm—Henry E. Otto, Jr.; Esther E. Klein

[57] ABSTRACT

A method for correcting error bursts in data which are uncorrectable by an ECC in a communications channel in which no pointer is available or if available is not generated. The data is recorded in blocks preferably comprising subblocks. Parity cell syndromes are generated for each block during writing; and during reading these syndromes are analyzed to identify possible starting points of error burst locations. A trial correction is applied to the data in the uncorrectable block (or subblock), then verified whether successful using CRC. The correction is accepted as valid if and only if only one trial correction is verified as successful. The maximum number B of consecutive bytes in error correctable in a block is less than, the number N of bytes in each parity cell, and N–B is selected to limit the probability of miscorrection.

8 Claims, 5 Drawing Sheets

*Prior Art*
*FIG. 1*

D = DATA BYTES (VARIABLE)
S = SUBBLOCK CHECK BYTES (6) / SUBBLOCK
C = CRC BYTES (4)
B = BLOCK CHECK BYTES (2)
P = PARITY BYTES (16)

FIG. 7

ABBREVIATED TRIAL-AND-ERROR TECHNIQUE FOR CORRECTING LONG BURSTS OF CONSECUTIVE ERRORS USING CRC BYTES This is a continuation of Ser. No. 08/372,704 filed Jan. 13, 1995, which is a continuation of application Ser. No. 08/239,163, filed May 06, 1994, which is a continuation of Ser. No. 07/810,280, filed Dec. 18, 1991, now abandoned.

FIELD OF THE INVENTION

This invention relates to a method for correcting long bursts of consecutive errors in data read from a communications channel such as a data storage device, and relates more particularly to such a method wherein after correction by a preselected error correcting code is exhausted, correction of long burst errors is implemented without requiring a pointer by a trial-and-error approach which minimizes the probability of false correction.

BACKGROUND OF THE INVENTION

U.S. Pat. No. 4,706,250 describes a method and apparatus using a two-level error correcting code (ECC) for correcting errors in variable length blocks of data read from a magnetic medium. The data is recorded in blocks each comprising a plurality of subblocks. This two-level multibyte ECC is capable of correcting up to $t_1$ errors in each subblock of a block of data and $t_2$ errors in one subblock of said block, where $t_2 > t_1$.

U.S. Pat. No. 4,916,701 discloses a burst correction method in which sequences of N consecutive parity check bytes are written at the end of each block of variable length data in a magnetic recording medium. Each block comprises subblocks of data bytes and corresponding check bytes and an ECC for which ECC syndromes are generated during reading. When a long burst error occurs, correction is attempted by using a pointer, derived by means separate from the ECC or parity bytes, to point to the first of the N consecutive bytes in a block that could have been affected by the error burst. All correctable errors are corrected in all subblocks not affected by the N bytes identified by the pointer. Then parity syndromes are adjusted for the corrected errors, and these adjusted syndromes are used to correct the errors in the N bytes identified by the pointer.

The method described in this latter patent is preferred if a pointer is available. The pointer is normally derived by detecting the source of the error, and for some error sources, such detection may not be possible. Even if the error source is normally detectable, variations in source characteristics can allow the source to escape detection and hence not generate a pointer. The methods of U.S. Pat. No. 4,916,701 are not applicable in the absence of a pointer.

It is therefore one object of this invention to provide a method for extending the error correcting capability of an ECC by using a trial and error approach wherein probability of miscorrection is minimized for correcting bursts of consecutive errors (1) in apparatus where no pointer is available or (2) in apparatus where a pointer, even if available, is not used or is unreliable. Another object is to provide such a method that may be used to supplement and back up the burst correcting capability of the pointer-implemented technique described in the above cited U.S. Pat. No. 4,916,701.

SUMMARY OF THE INVENTION

When no pointer is available or if available is not generated, the parity bytes are used, in accordance with the invention, for correcting by a trial and error approach, long bursts of errors in data in a communications channel which are uncorrectable by an ECC. The basic idea of the approach is to assume various trial positions, perform correction and rely on some error detection means, such as the CRC (Cyclic Redundancy Check) to identify the correct trial position.

A "brute force" trial and error approach, wherein each byte position is examined in turn as a possible starting point for the burst error, is not practical or acceptable. Each trial in a trial and error approach requires the use of the CRC for verification of corrected data. The high number of trials involved in this brute force approach raises a risk that the CRC might verify an incorrect correction attempt, resulting in a possible data integrity violation. Also the time required to implement correction with a brute force approach is unacceptably long.

The data is recorded in blocks preferably comprising subblocks. Parity cell syndromes are generated for each block during writing; and during reading these syndromes are analyzed to identify possible starting points of error burst locations. A trial correction is applied to the data in the uncorrectable block (or subblock), then verified whether successful using CRC. The correction is accepted as valid if and only if only one trial correction is verified as successful. The maximum number B of consecutive bytes in error correctable in a block is less than, the number N of bytes in each parity cell, and, therefore, N–B is selected to limit the probability of miscorrection.

DESCRIPTION OF PREFERRED EMBODIMENTS

Preliminary

In the two-level ECC system as described in U.S. Pat. No. 4,706,250 and illustrated in FIG. 1, data is recorded in blocks of variable (or fixed) length each comprising a plurality of subblocks, preferably of the same length except possibly the last. Each subblock comprises a variable (or fixed) number of data bytes and six subblock check bytes S for first level error correction. At the end of the last subblock in the block are four CRC bytes C for data integrity checking, followed by two block check bytes B for second level error correction.

Figure 2:
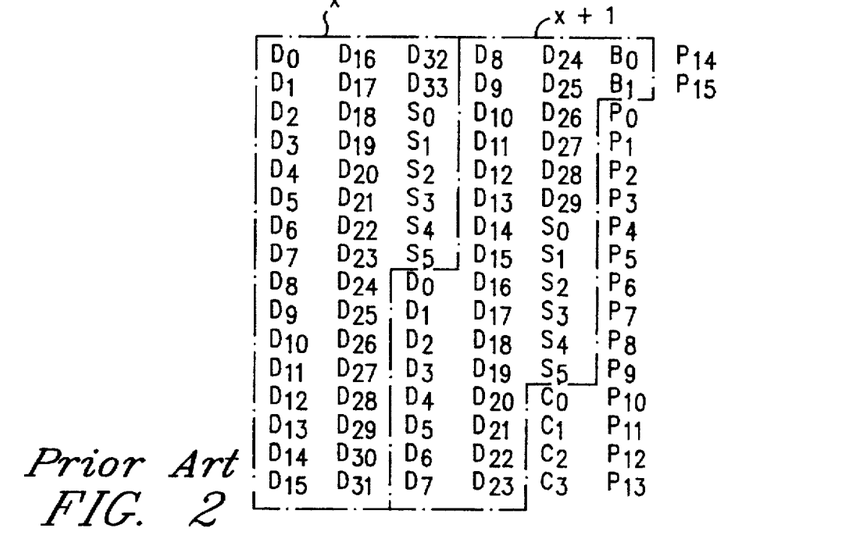
FIG. 2 illustrates how each parity byte is computed from the consecutive ordered sets of interleaved data bytes and check bytes in a subblock to form N parity groups (N assumed as 16 for simplification)

As described in U.S. Pat. No. 4,916,701, a sequence of N parity check bytes P is written at the end of each block in the gap between it and the succeeding block; i.e. in the inter-block gap. The parity byte $P_0$ immediately follows $B_1$, the last block check byte. As illustrated in FIG. 2, these parity check bytes P make an interleaved parity check across N consecutive ordered groups of data bytes, check bytes and CRC bytes; i.e., all bytes in each ordered group are N bytes apart, and all bytes in the block are counted in determining the displacement in the count/key/data (CKD) area to which the parity bytes are appended. The number N is preselected to equal the longest anticipated burst of consecutive errors so that no single long-burst error can affect more than one byte in any one of the N parity groups. As customary in parity checks, all bytes are exclusively OR'd (XOR'd). As used in this specification and in the claims, the term "byte" is defined as comprising one or more bits.

In FIG. 2, it is assumed for sake of illustration that N is 16, and that parity bytes $P_0$ through $P_{15}$ are therefore written in order immediately following the last byte (block check byte $B_1$) of the block. Thus, the parity group including $P_0$ is the result of XORing bytes $D_2$, $D_{18}$, $S_0$ of subblock X and $D_{10}$ and $D_{26}$ of subblock X+1; and the parity group including $P_{11}$ is the result of XORing bytes $D_{13}$, $D_{29}$ of subblock X and $D_5$, $D_{21}$ of subblock X+1 and $C_1$.

Figure 3:
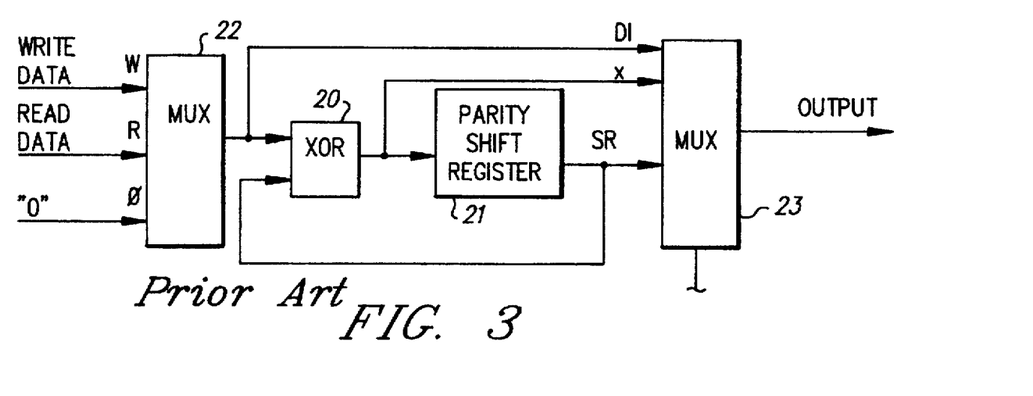
FIG. 3 depicts an embodiment of the logic circuitry for generating the parity bytes during writing and the parity syndromes during reading.

FIG. 3 depicts an exclusive OR gate (XOR) 20, a parity shift register 21 and multiplexers 22 and 23 each of which is one byte wide. Register 21 has a length of N stages (assumed, as already stated, as 16).

Figure 1:
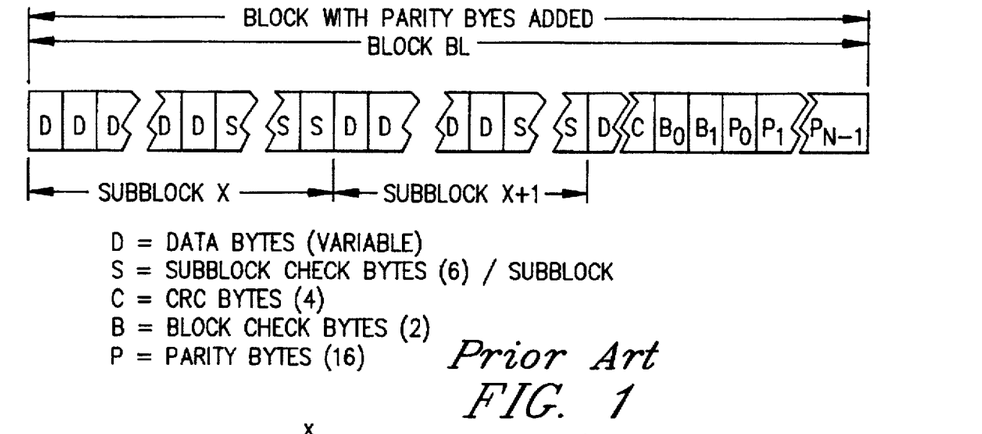
FIG. 1 illustrates a two-level ECC format with which the invention may be implemented.

Assume initially that shift register 21 has been reset to zero in conventional manner. To write on a communications channel, hereinafter assumed as a rotating magnetic medium (not shown), multiplexer 22 is conditioned to connect Write Data line W to XOR 20 and gate all bytes BL of each block via Data In line DI and multiplexer 23 to the Output for writing on a selected track of the magnetic medium. Thus Data In includes all data bytes followed by appropriate check bytes through $B_1$ as illustrated in FIG. 1. At the end of Data In, multiplexers 22 and 23 are conditioned to connect line 0 to XOR 20 and gate the N parity bytes $P_0$ through $P_{15}$ from the parity shift register 21 to the Output via line SR.

To read data from the magnetic medium and calculate the parity byte syndromes, multiplexers 22 and 23 are conditioned to connect Read Data line R to Data In line DI and gate all bytes BL of each block to the Output via line DL. Thereupon, multiplexers 22 and 23 are conditioned to gate the N parity bytes $P_0$ through $P_{15}$ from line R to XOR 20 and gate the output of XOR 20 to the Output via line X.

The resultant output is the BL bytes of the block with the 16 parity byte syndromes appended.

In operation, assume that during reading, there are errors detected, but none are long-burst errors. Under this condition, error correction and verification will be effected using algorithmic correction techniques, as explained in the cited U.S. Pat. No. 4,706,250 and prior art referenced therein, using the subblock check, block check and CRC (cyclic redundancy check) syndromes. At the subblock level up to $t_1$ errors can be corrected and up to $t_1+c$ errors detected where c is a preselected number of additional errors. Thereafter, at the block level, up to $t_2$ errors are correctable in any one of the subblocks of the block.

If there are more errors than can be corrected, correction is abandoned and the error is treated as uncorrectable. The structure and mode of operation as above described form no part of the present invention.

Note that in the absence of a long-burst error, the parity bytes need not be read. Hence, under normal conditions, with no long-burst error, preparations for processing the next block can be started without reading the parity bytes. Conventionally this processing is done as the read head passes over the inter-block gap—the area that is left unrecorded for this purpose. As in U.S. Pat. No. 4,916,701, the parity bytes will be recorded in this inter-block gap and will be read only if long-burst error recovery is required. Thus long-burst error protection is obtained without increasing the length of the medium required for the check bytes and the inter-block gap.

Trial-and-Error Technique

The term "communications channel" as herein used in the specification and claims is intended generically to connote a magnetic medium such as a disk or tape, an optical medium, or a channel employing wire, optical or other means for transmission of data.

To simplify the following more detailed description of the invention, it is convenient to introduce the concept of a cell. A data cell comprises N consecutive data bytes and may contain CRC bytes and/or subblock and/or block check bytes, where N is the number of parity groups. The consecutive bytes of a cell belong to a parity groups 0 through N−1 respectively. The parity bytes of parity groups 0 through N−1 can also be considered as comprising a parity cell, and the parity byte syndromes can similarly be considered as a cell. The parity group to which a byte or syndrome in a cell belongs will be referred to as the index of the byte or syndrome.

Assume that, during reading, a long-burst error is detected. Subblock check, block check and CRC syndromes are calculated as in the absence of a long-burst error. Also, the parity bytes are read and the parity byte syndromes are calculated as described above and in U.S. Pat. No. 4,916,701.

According to the invention, the long-burst error is located and corrected by an abbreviated trial-and-error technique which will now be described in detail.

First level correction of each subblock in error is attempted using the subblock check byte syndromes. The CRC, block check and parity syndromes are adjusted for each correction made as described in U.S. Pat. No. 4,916,701.

Each subblock where errors were uncorrectable by the first level correction is identified as a candidate for burst error correction trial-and-error examination using parity cell syndromes. Assuming an N-byte parity cell and an error burst B bytes in length (where B<N), there will be N−B zero syndromes. Since the parity cell syndromes are ordered by parity group in the same way as the bytes they check, the N−B zero syndromes will be sequential. The length of the burst that will be correctable is limited to B bytes by requiring that the longest sequence of zeros in the parity cell syndromes be at least N−B for correction to be attempted. This limitation has two beneficial effects on limiting data integrity exposure:

(1) Making a sequence of N−B zero syndromes a prerequisite for a correction attempt reduces the data integrity exposure in trial-and-error attempts to correct a catastrophic uncorrectable error. Note that an error burst longer than N bytes (the length of the parity cell) is uncorrectable; and if this occurs, each parity cell syndrome will be an error pattern or the sum of several error patterns, and in such event, the parity cell syndromes will not be likely to have a sequence of multiple consecutive zero-syndromes.

(2) The number of trials is limited, thereby desirably limiting both the data integrity exposure and the time required to complete the trial-and-error correction process. Note that the zero-syndrome sequence in the parity cell should represent the sum of parity checks on bytes outside the error burst; and the location of this burst in the parity cell thus gives the location of the error burst within the cell boundaries. Knowing this, correction need be tried at only one specific byte position (i.e., at only a certain sequence of bit positions of only one of the bytes of each data cell) for each successive data cell in the subblock starting with the first non-zero syndrome following the sequence of zero syndromes. This will become clearer in connection with the discussion of FIG. 6.

Correction is attempted on the uncorrectable subblock at each occurrence of a byte in the subblock which is in the same parity group as the error pattern of the first byte of the error burst as identified from the parity cell syndromes. The attempt is made by XORing the bits of this first byte error pattern with the corresponding subblock byte. Each of the other parity cell syndromes is XOR'd with the first subblock byte in its parity group following this subblock byte. Each XORing is accompanied by appropriate adjustment of CRC syndromes to account for the change. Following each attempt, the correction is tested by examination of the CRC syndromes.

If the trial correction is verified as acceptable by the CRC, this information will be stored. Whether or not correction is verified as acceptable, correction will be attempted for each of the possible error burst locations, etc. until all cells have been tried. The correction will be accepted as successful and valid if one and only one of the trial attempts is verified as acceptable. Correction is tried at the identified specific byte in each cell, as just stated, because there is a possibility that a trial correction verified by the CRC as acceptable may erroneously be accepted as valid before the identified specific byte position in the correct cell is tried and accepted, in which case data integrity will be violated.

Figure 4A:
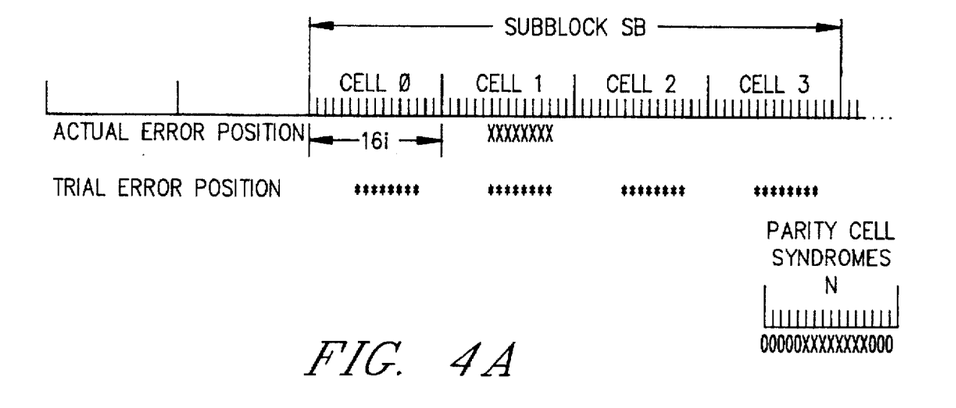
FIGS. 4A, 4B and 4C illustrate various conditions under which burst errors are correctable.
Figure 4B:
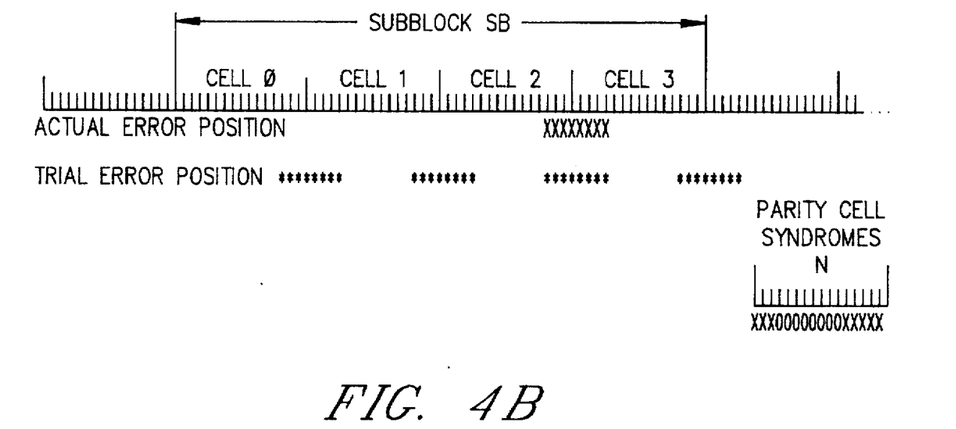
Figure 4C:
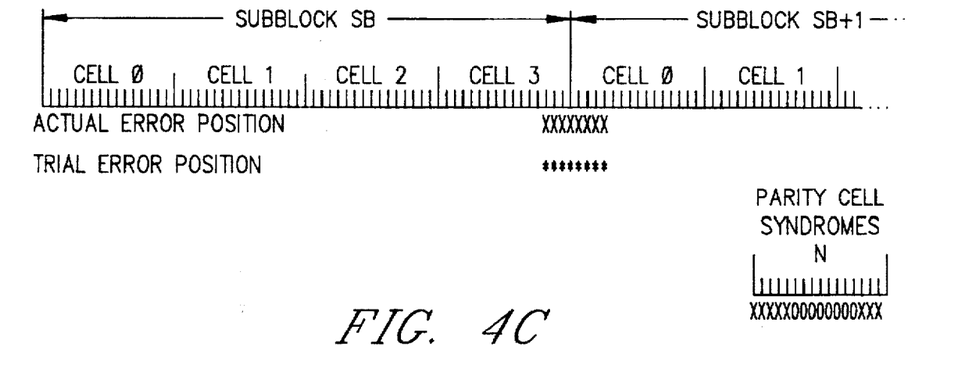

Since the parity cell syndromes can correct only a single burst, the burst must be limited to one subblock or two successive subblocks. FIGS. 4A, 4B and 4C illustrate various conditions under which a long-burst error is correctable. In these figures and for FIG. 5, each subblock consists of J data cells, and each data cell consists if N bytes. For simplification, it will be assumed that J=4 and N=16.

FIG. 4A shows a burst-type error that occurs within a single cell (cell 1) of a subblock SB. FIG. 4B shows a burst-type error which affects two adjacent cells (cells 2 and 3) in the same subblock SB. FIG. 4C shows a burst-type error which affects two adjacent cells (cell 3 and cell 0) in two adjacent subblocks SB and SB+1.

It has thus far been assumed that only one subblock is first level uncorrectable and that the parity cell syndromes are applied by the trial-and-error technique to burst errors that affect only that one subblock, such as illustrated in FIG. 4A or FIG. 4B. If two successive subblocks are first-level uncorrectable, as illustrated in FIG. 4C, correction is simplified. The error is clearly identified as starting in the last cell of the first uncorrectable subblock SB and the sequence of zero syndromes indicates the end of the burst error within the first cell of the second cell block SB+1. Hence, no trial-and-error is necessary.

Figure 5:
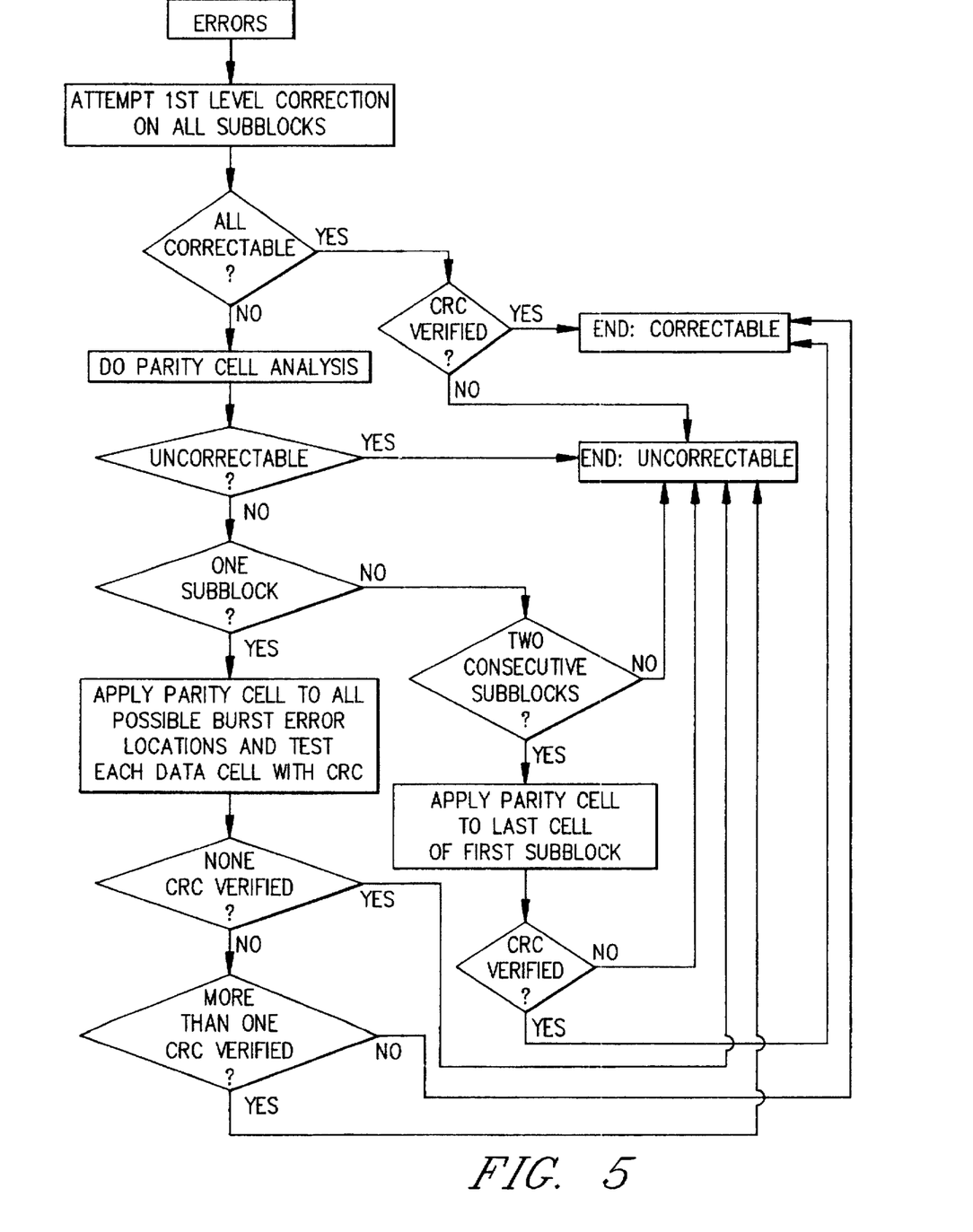
FIG. 5 constitutes a flow chart showing the steps in implementing applicant's trial-and-error correction method.

FIG. 5 constitutes a flow chart depicting the steps in applying applicant's trial and error burst error correction technique, which may be narratively described as follows:

After reading the block and calculating the ECC and CRC syndromes, the first level of correction for the two-level ECC is attempted on those blocks where non-zero subblock syndromes indicate an error. If all subblocks in error appear to be correctable at first level, the correction is accepted as valid subject to verification by the CRC. If more than two subblocks or if two nonconsecutive subblocks are uncorrectable at first level, correction attempts are abandoned and the error is normally considered uncorrectable.

According to the invention, if one subblock or two successive subblocks are uncorrectable at first level, correction proceeds by analysis of the parity syndrome cell. The parity syndrome cell is searched for the longest sequence of zero parity syndromes. For purposes of this search and all other uses of the parity syndrome cell, the syndromes are treated as a ring, such that syndrome $0$ sequentially follows syndrome N–1 to identify the first non-zero syndrome after the longest zero sequence within each data cell as a potential startup point for an error burst location.

If the longest sequence of zero syndromes in the parity syndrome cell is less than N–B syndromes, where B is the preselected maximum error burst length to be corrected, correction is abandoned and the error is considered uncorrectable. The preferred value for N–B is 8, but this should not be considered limiting. Assume that the longest sequence of zero syndromes in the parity syndrome cell is N–B or more syndromes, and that K denotes the index in the parity syndrome cell of the first non-zero syndrome following this burst.

Assume now there are two successive subblocks uncorrectable at first level. Correction is applied to the byte with index K in cell J–1 of the first uncorrectable subblock; i.e., byte K+N(J–1) of the subblock.

If there is one subblock uncorrectable at first level, J trial corrections are applied. Each trial correction is applied to the byte with index K in cell i of the subblock. i.e., byte K+Ni of the subblock where i=$0$, 1, . . . J–1. Each trial is tested for correctness by the CRC and/or other error detection means. A trial correction will be accepted if and only if it is the only trial correction verified as acceptable by the CRC.

Each trial correction needs to be applied to the data as read. Each trial contaminates the data. One method of applying the trial corrections is to apply them to a working copy of the data made from an uncontaminated master copy; and in such case, the correction consists of XORing error patterns, either parity byte syndromes or calculated from the ECC syndromes, with the data. Alternatively, the trial corrections can be made to the master copy and the contamination removed for the next trial by reverse XORing to repeat and thereby undo the correction.

Figure 6:
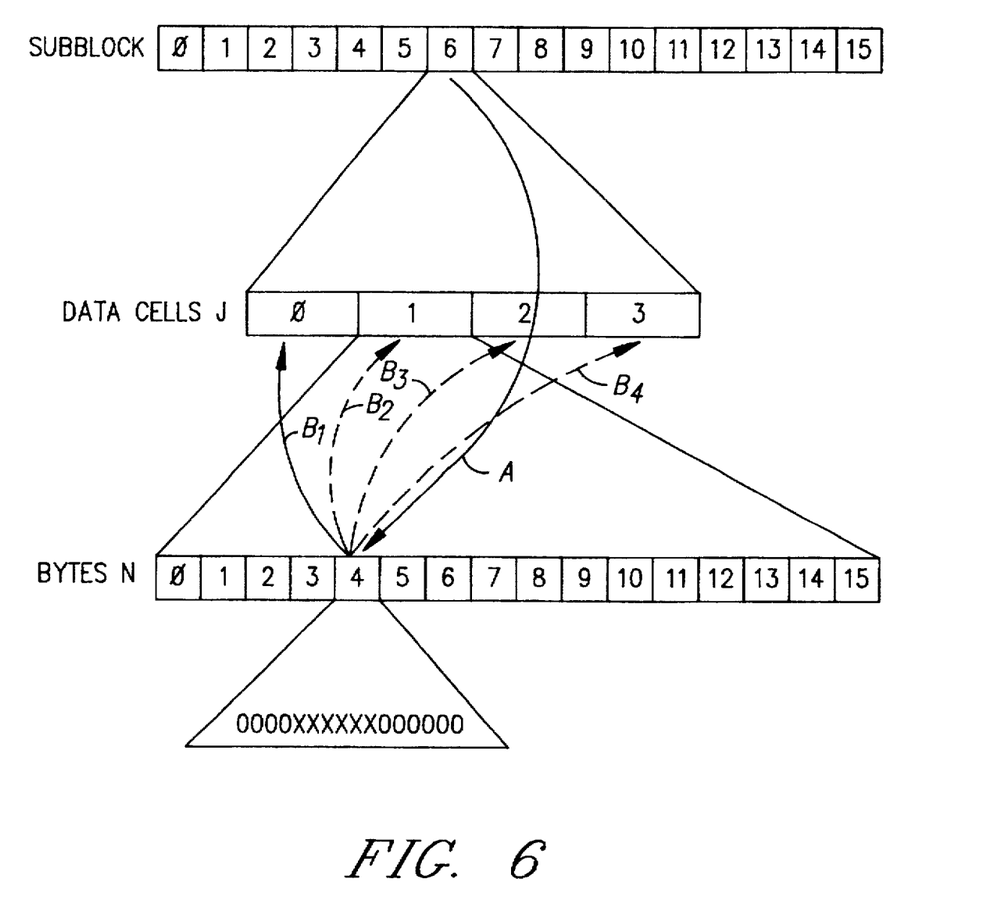
FIG. 6 is a schematic diagram depicting a two-level ECC format including subblocks, each for simplification comprising a fixed number (assumed as 4) cells, each cell comprising a preselected number (assumed as 16) bytes, and illustrating the burst correcting technique embodying to the invention.

FIG. 6 depicts how the trial-and-error analysis of first level ECC uncorrectable errors in one subblock (or consecutive errors in two adjacent subblocks) proceeds directly (via A) from the affected subblock(s) to the bytes in error using parity cell syndromes and then how the bytes requiring correction in a cell (or in adjacent cells) are determined as illustrated in FIG. 6 by trial and error examination of the byte positions in error in each data cell. It may be convenient to examine the data cells by trial and error in sequence (such as $B_1$, $B_2$, $B_3$, $B_4$) starting with cell $0$ as illustrated in FIG. 6. However, they may be examined in any order as long as each is examined.

Assume now a burst error affects bit positions 5–10 of the 16-bit byte 4 of cell 1 of subblock 6. The bit position 5 of byte 4 will be identified as the staring point of the burst. Then correction will be attempted cell-by-cell by XORing the bits at bit positions 5–10 only in each byte 4 of each cell. This technique not only reduces the correction time as compared to the "brute force" correction approach but also by reducing the number of correction attempts and consequent XORing and reverse XORing, limits the probability of miscorrection.

Figure 7:
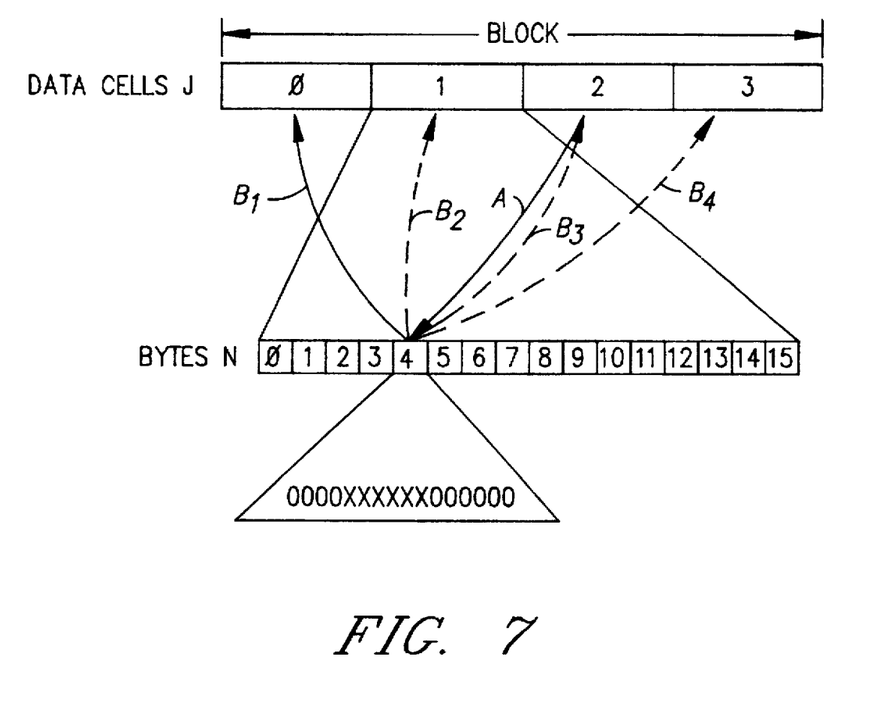
FIG. 7 is a schematic diagram illustrating how the invention may be implemented with a one-level ECC format comprising blocks not divided into subblocks.

It will be apparent that this trial-and-error technique may, if desired, be applied to a single level ECC, although admittedly it will be somewhat less effective. This is done by considering the subblock of FIG. 6 as a block consisting of J cells each comprising N bytes, as illustrated in FIG. 7. In such case, the parity cell syndromes are used to identify the erroneous byte positions or index within the cell in error (but not which cell is in error), and then correction is attempted by XORing (then reverse XORing) each cell in the block (successively or otherwise) to identify which cell in the block is in error. As before, if the CRC indicates acceptability of the correction of one and only one cell, the correction is accepted as valid; otherwise the error is considered uncorrectable and the error burst correction attempt is abandoned.

In summary, according to important features of the invention, the location of a burst error is determined by an abbreviated trial-and-error technique wherein the number of potential error locations examined is drastically limited. This not only reduces the time for error correction but also minimizes the probability of miscorrection. Briefly, this technique involves:

(1) Restricting examination to subblocks uncorrectable by the ECC at first level;

(2) Limiting the number of consecutive correctable bytes in an error burst to less than the number of bytes in a parity cell to allow parity cell syndrome analysis;

(3) Using parity cell syndrome analysis, identifying the possible error burst locations in the uncorrectable subblock;

(4) Provisionally correcting the data at each possible burst location by trial and error, and testing the acceptability of the correction by CRC; and (5) Accepting the burst error correction as valid if one and only one trial correction is verified as acceptable by the CRC.

In the embodiment illustrated and above discussed, it has been assumed for simplification that there is only one sequence of at least N–B zero parity cell syndromes, and thus only one possible starting location of the error burst within the boundaries of a data cell. If there should be more than one sequence of at least N–B zero parity cell syndromes and thus more than one possible starting location of the error burst within the data cell boundaries, it will be understood that the method herein discussed may readily be extended to identify and test (as indicated in FIG. 5) more than one starting position within a data cell.

While the invention has been described in connection with preferred embodiments thereof, it will be understood that changes may be made in the method herein disclosed within the teachings of the invention. The embodiments illustrated are therefore to be considered as merely illustrative and the invention is not to be considered limited except as required by the claims.

We claim:

1. A method of correcting multi-byte errors in a communications channel on which data is recorded in blocks that comprise sub-blocks each including data bytes in data cells and check bytes providing an error correcting code (ECC) and for which ECC syndromes are generated during reading, said method comprising the steps of:

writing at the end of each block CRC bytes and a parity cell comprising a sequence of N sequential parity check bytes, each byte of the parity cell being a logical combination of a corresponding byte of each cell of each sub-block;

during reading, after the generation of the ECC syndromes, generating parity cell syndromes for each block by comparing the parity check bytes computed from the data bytes and check bytes as read with the parity check bytes as written;

after detecting an error burst following an attempted ECC correction on all sub-blocks and determining that a pointer to a first byte of the error burst can not be derived by means separate from the ECC or parity bytes, responsive to a string of at least N–B zero syndromes of said parity cell syndromes where B<N and B is the maximum number of consecutive bytes in an error burst correctable in a particular block by its parity cells, identifying for trial by parity syndrome analysis, a possible byte position location in each cell of each sub-block containing errors uncorrectable using said ECC, each said identified location representing a first byte in a possible error burst having a maximum length of B bytes;

utilizing said parity cell, performing a series of trial corrections of the data in different data cells at each said identified byte position location in each data cell by logically applying said parity cell at each said identified byte position location;

following each trial correction, using the CRC bytes to verify whether the correction is acceptable;

storing information identifying any trial correction verified by the CRC bytes as acceptable; and accepting correction of said error burst as successful and valid if and only if one and no more than one trial correction is verified as acceptable by the CRC bytes.

2. A method of correcting multi-byte errors in a communications channel on which data is recorded in blocks that comprise, in addition to data bytes in data cells, check bytes that provide error correction for an error correcting code (ECC) and for which ECC syndromes are generated during reading, said method comprising the steps of:

writing at the end of each block CRC bytes and a parity cell comprising a sequence of N sequential parity check bytes;

during reading, after the generation of the ECC syndromes, generating parity cell syndromes for each block by comparing the parity check bytes computed from the data bytes and check bytes as read with the parity check bytes as written;

responsive to a string of at least N–B zero syndromes of said parity cell syndromes where B<N and B is the maximum number of consecutive bytes in an error burst correctable in a particular block by its parity cells, identifying for trial, by parity syndrome analysis, possible byte position locations in blocks containing errors uncorrectable by said ECC, each said identified location representing a first byte in a possible error burst having a maximum length of B bytes, said byte position location corresponding to a byte position indicated as having a possible error by the parity cell syndrome;

utilizing said parity cell, performing a series of trial corrections of the data in different data cells at each said identified byte position location by logically applying said parity cell at each said identified byte position location;

following each trial correction, using the CRC bytes to verify whether the correction is acceptable;

storing information identifying any trial correction verified as acceptable by the CRC bytes; and accepting correction of said error burst as successful and valid if and only if one and no more than one trial correction is verified as acceptable by the CRC bytes.

3. A method for correcting bursts of consecutive errors in a communications channel without requiring a conventional pointer detected from the error source, comprising the steps of:

recording data in blocks, each comprising a series of data cells and appended CRC bytes and parity cells;

upon determining during reading of the data that errors in one of said blocks are uncorrectable by an ECC, calculating and analyzing parity cells for that block to identify a sequence of such syndromes with the longest number of zeroes as indicating a possible starting byte location of an error burst;

performing a series of trial corrections in different data cells at the identified error burst location;

following each trial correction, using the CRC bytes to verify whether that trial correction is acceptable; and accepting correction of the burst error as successful and valid if and only if there exists one and no more than one acceptable trial correction.

4. The method of claim 3, including the step of:

prior to the performing step, generating a working copy of the data as read from an uncontaminated master copy; and then during the performing step, applying each trial correction to the working copy to avoid contaminating the master copy; and after accepting correction of the error burst as successful and valid, applying said correction to the master copy.

5. The method of claim 3, including during the calculating and analyzing step, treating said syndromes as a ring for identifying as a potential starting point within each data cell for an error burst location in the uncorrectable block, the first non-zero parity cell syndrome following said sequence.

6. In a communication channel on which data are recorded in blocks that comprise a plurality of subblocks, each subblock including a plurality of cells comprising N data bytes, each block further including check bytes providing error correction code (ECC) for correcting a limited number of errors in a block and CRC bytes used in verifying a data error correction, a method of correcting burst errors of a length B where B<N comprising the steps of:

a) calculating a parity cell, wherein each byte of a parity cell is a logical combination of each corresponding byte position of each cell of each subblock;

b) writing at the end of each block said parity cell;

c) during reading of a block of data:

(I) generating ECC syndromes for the read block;

(ii) using the ECC check bytes to correct the limited number of errors in each subblock of the read block correctable by the ECC check bytes;

(iii) identifying a subblock having data errors not correctable using the ECC check bytes;

(iv) reading a parity cell corresponding to the read block;

(v) calculating a parity cell syndrome based on the read block and the read parity cell; and (vi) using said parity cell syndrome to identify a possible starting byte location of the burst errors of a length B by identifying a string of at least N−B zero bytes of said parity cell syndrome where a first non-zero byte location adjacent said string of at least N−B zero bytes identifies a possible starting byte position of the burst errors of a length B in one of the cells of the subblock.

7. The method of claim 6 further comprising the steps of:

(vii) performing a series of trial corrections on the identified subblock having data errors not correctable using the ECC check bytes, at the identified starting byte location in each cell of the identified subblock; and (viii) following each trial correction, using the CRC bytes to verify whether the trial correction is acceptable.

8. The method of claim 7 further comprising the step of performing trial corrections at each possible starting byte location in each cell of the identified subblock and only accepting the correction of an error burst as successful and valid if and only if one and no more than one trial corrections is verified as acceptable.

* * * * *